United States Patent [19]

Hoyt, III et al.

[11] Patent Number: 4,722,659

[45] Date of Patent: Feb. 2, 1988

[54] SEMICONDUCTOR WAFER CARRIER TRANSPORT APPARATUS

[75] Inventors: Hazen L. Hoyt, III, Costa Mesa; John D. Sanders, Tustin; Jon C. Goldman, Orange; William R. Mello, Huntington Beach, all of Calif.

[73] Assignee: Thermco Systems, Inc., Orange, Calif.

[21] Appl. No.: 863,961

[22] Filed: May 16, 1986

[51] Int. Cl.$^4$ .............................................. B65B 21/02
[52] U.S. Cl. ................................... 414/416; 414/403; 414/786
[58] Field of Search ............... 414/403, 404, 416, 417, 414/786; 211/41

[56] References Cited

U.S. PATENT DOCUMENTS

| | | | |
|---|---|---|---|
| 4,466,766 | 8/1984 | Geren et al. | 414/404 |
| 4,568,234 | 2/1986 | Lee et al. | 414/416 |
| 4,597,708 | 7/1986 | Wheeler et al. | 414/416 |
| 4,603,897 | 8/1986 | Foulke et al. | 414/416 |
| 4,611,966 | 9/1986 | Johnson | 414/404 |
| 4,643,629 | 2/1987 | Takahashi et al. | 414/416 |

*Primary Examiner*—James T. McCall
*Attorney, Agent, or Firm*—John K. Williamson; James C. Valentine

[57] ABSTRACT

Semiconductor wafers in plastic cassettes are loaded into (and later unloaded from) an input/output station serving a CVD furnace and thereafter the cassettes are non-manually transported by a programmable elevator to and from a flat-finder, a wafer transfer machine (where the wafers are transferred to a boat) and in-process storage. The boats are non-manually transported by a second programmable elevator to and from the wafer transfer machine, in-process boat storage and a boat loader (or process chamber directly). The cassettes can be loaded or unloaded while one or both of the elevators are operating. Up to eight human assisted steps are reduced to only two such steps.

Furnaces having more than one processing chamber have a loading station, in-process cassettes and boat storage and boats dedicated to each processing chamber so that there is no cross contamination between processing chambers caused by the boats and the cassettes in which wafers are delivered to the process are the same cassettes in which process wafers are returned to the input/output station so that there is no cross contamination of the wafers caused by the cassettes.

6 Claims, 11 Drawing Figures

SEMICONDUCTOR WAFER CARRIER TRANSPORT APPARATUS

This invention relates to improved apparatus for transporting semiconductor wafers during wafer fabrication and, more particularly, to apparatus for non-manually transferring the wafers from plastic cassettes to quartz boats and then transporting the wafer ladened boats to so-called "boat loaders" for ultimately loading the wafers into a high temperature furnace.

Semiconductor wafers must be fabricated in controlled atmosphere rooms in order to reduce contamination of the wafers by airborne particles to the lowest practical levels. One of the principal sources of such particles is the people who operate the equipment. According to the published literature, a person at rest sheds more than 100,000 microscopic particles a minute of flaking flesh, saliva, hair spray, make-up, dried shaving cream, lint, sodium, dandruff and dead mouth tissue. That person sheds about 500,000 particles a minute with only slight head movement, about five million particles a minute with slow walking and about thirty million particles a minute with exercising. Obviously, for this reason alone, it would be an improvement to reduce people involvement in the fabrication of wafers if this could be done without so complicating the operations or increasing their costs as to make the improvement impractical or unjustifiable.

Figure 1:
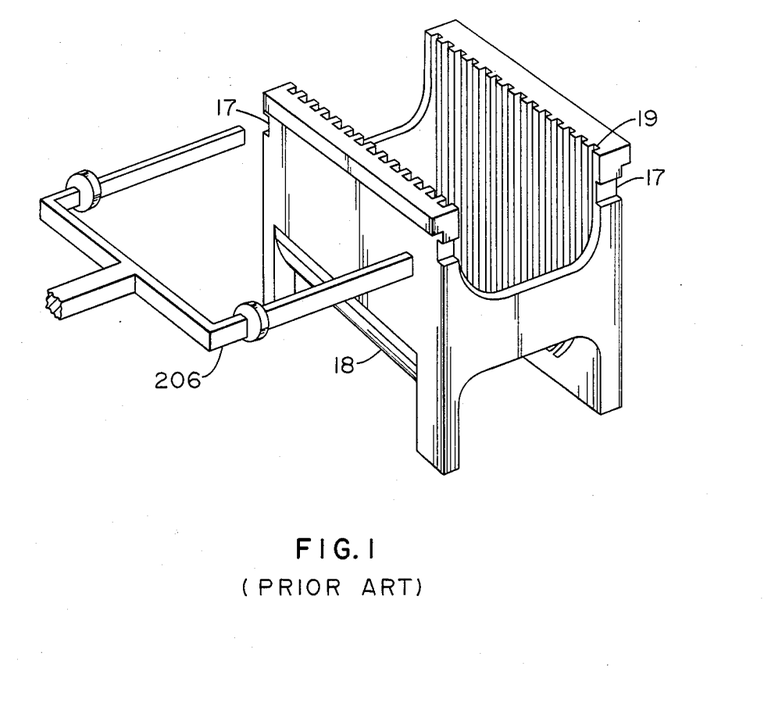
FIG. 1 is a perspective view of a conventional plastic cassette used to transport semiconductor wafers in fabrication plants.
Figure 2:
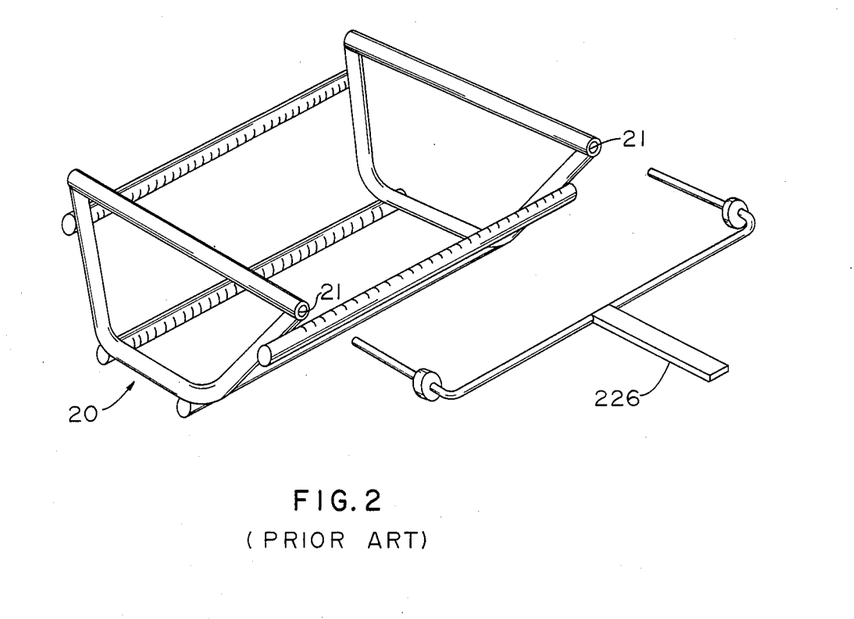
FIG. 2 is a perspective view of a conventional boat used to transport semiconductor wafers in high temperature furnaces.

In conventional wafer fabrication plants, wafers are commonly transported from one process to another in plastic cassettes. FIG. 1 shows a typical plastic cassette 18 for containing semiconductor wafers 12 having peripheral edges 14 including a flat chord portion 16 and a fork 206 for carrying the cassette 18. However, the plastic cassettes 18 cannot be used in certain processes. In particular, they cannot stand up to the high temperatures of deposition, diffusion, oxidation and annealing processes in so-called "CVD" furnaces where the nominal process temperature may be as high as 1000° C. or even higher. Thus, the wafers 12 must first be transferred to so-called "boats" which may be made of quartz or other high temperature material compatible with the process before processing. FIG. 2 shows a conventional boat 20 and a fork 226 for carrying the boat 20. Typically, the wafer ladened cassettes 18 are placed on a wafer alignment means ("flat-finder") for orienting the chord portion 16 of the peripheral edges 14 of the wafers 12. The cassettes 18 with oriented wafers 12 are then placed on a wafer transfer machine for transferring the wafers from a cassette 18 to a boat 20. Finally, the boats 20 are transported to boat loaders which then transport the boats to the furnaces.

The improvement of the present invention permits the handling of wafers for processing in CVD furnaces to be reduced from about eight manually assisted steps to only two such steps. An operator need only load and unload wafer ladened plastic cassettes into and from an input/output station and the improved apparatus then performs all of the wafer handling steps appurtenant to the operation of the flat-finders, the wafer transfer machines and the CVD furnaces. As the following description of a preferred embodiment of the improvement shows, wafer ladened cassettes may safely be manually loaded or unloaded into or from an extendable drawer while other cassettes and boats are transported and/or while other wafers are transferred between cassettes and boats. In addition, a first elevator means having an end-effector ("robot") for transferring cassettes and a second robot for transferring boats may operate simultaneously while a drawer is being loaded or unloaded.

Where the improvement is utilized with furnaces comprising multiple deposition chambers such as a vertical stack of four horizontally disposed process tubes, multiple drawers and boats may be used where each drawer and certain boats are dedicated to one process tube and the identical cassettes may be used for supplying and removing wafers so that a major source of operator error and cross-contamination may be eliminated. In the preferred embodiment, wafer ladened boats may be queued while the associated furnace is processing a batch so that the furnaces may be used to the maximum possible extent. Accordingly, it is estimated that the improved apparatus may increase the through-put of wafers in a stack of four process tubes up to 20–30% in a commercial operation. In addition, the reduction in number of manually assisted operations may permit a smaller overall "footprint" of the apparatus.

Most broadly considered, the improved apparatus has an input drawer which is moveable between an extended open position for loading wafer ladened first carriers such as, e.g., plastic cassettes, into the drawer and a retracted closed position for subsequent non-manual removal of the first carriers; in-process first carrier storage for empty carriers; a wafer alignment means for orienting the wafers in the first carriers; a wafer transfer means for transferring wafers from the first carriers to second carriers such as, e.g., quartz boats; and a first elevator means having an end-effector for transporting the first carriers to and from the closed drawer, the in-process storage for the first carriers, the wafer alignment means and the wafer transfer means. The apparatus also has in-process second carrier storage, and a second elevator means having an end-effector for transporting the second carriers to and from the wafer transfer machine, the in-process storage for the second carriers and the boat loaders (or other proven second carrier loading means) which then load the boats into the CVD furnaces.

Other details, objects and advantages of the invention will become apparent as the following description of a presently preferred embodiment thereof proceeds.

In the accompanying drawings of a presently preferred embodiment

in FIG. 6

Generally speaking, the apparatus shown in FIGS. 3-11 receives wafers in the cassettes 18 of FIG. 1 in an input/output drawer 52, 54, 56 or 58, processes the wafers then in the boats of FIG. 2 at high temperatures in a CVD furnace and then returns the processed wafers in the cassettes 18 in the input/output drawer for further processing.

Figure 3:
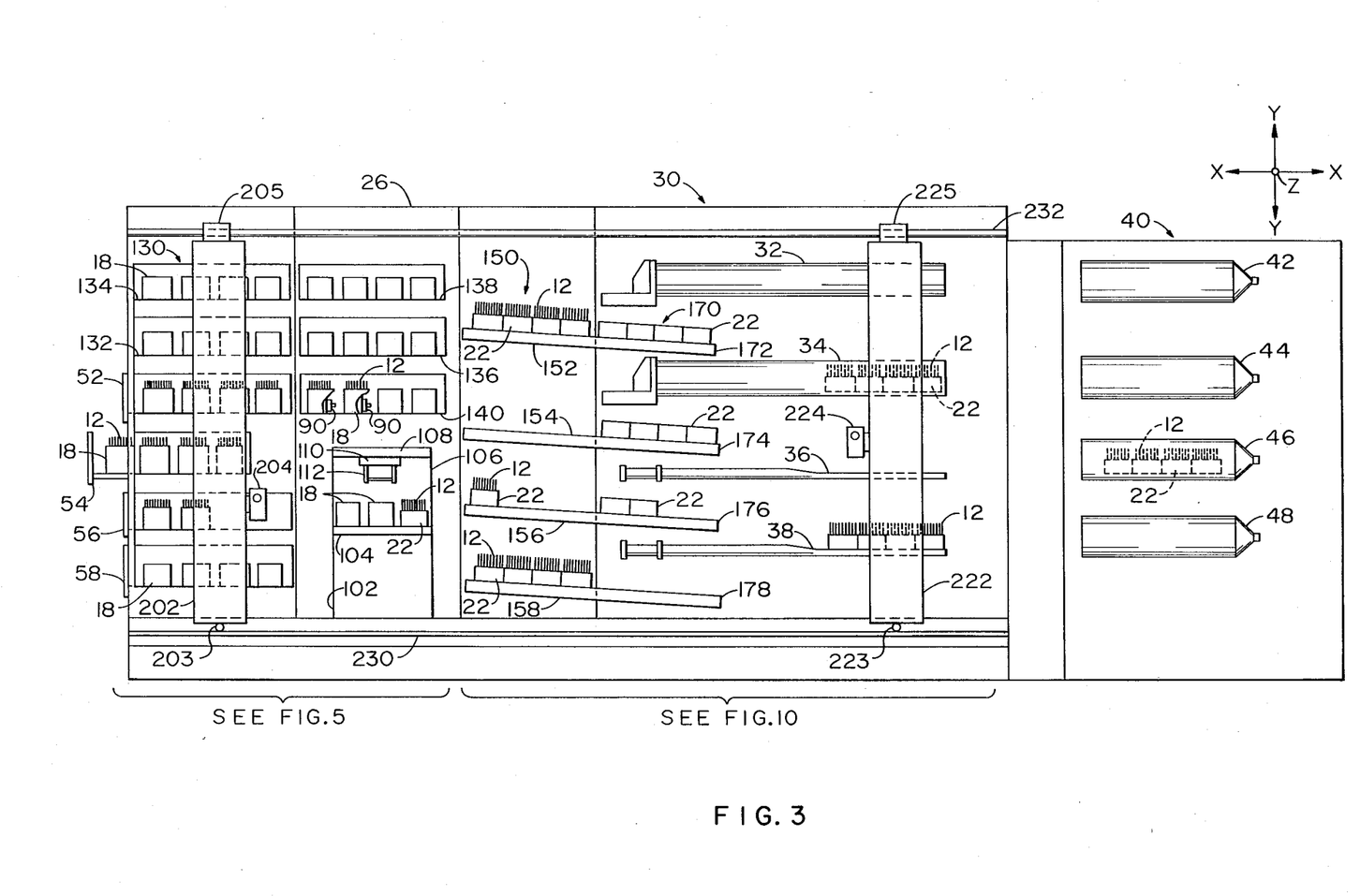
FIG. 3 is a schematic front view of the improved apparatus of the present invention and a conventional high temperature furnace.

FIG. 3 shows an open (along the front side) cabinet 26 which may contain a furnace loading station 30 having four boat loaders 32, 34, 36 and 38 which are axially aligned and operatively associated with processing chambers such as four horizontally disposed process tubes 42, 44, 46 and 48 of an adjacent "hot wall" furnace 40. Alternatively, the loading station 30 may be contained in a separate cabinet. The loading station 30 and furnace 40 illustrate a type of system sold by Thermco Systems, Inc. of Orange, Calif. and others. In such systems, the process tubes may treat up to about 200 wafers at one time in a batch operated process. Because the plastic cassettes 18 generally hold about 25 wafers and the boats 20 generally hold about 50 wafers, a batch of wafers may involve up to eight plastic cassettes 18 and four boats 20 (not including the boats carrying dummy wafers, if used). Obviously, the invention may be used with other systems, including those utilizing one or more vertical or horizontal processing chambers, and with any number of wafers per batch or any size wafers. Because different processes may be run in different process tubes 42, 44, 46 and 48 and because it is otherwise desirable to reduce the possibilities of cross contamination, it is preferred that boats be dedicated entirely to a particular process tube in the furnace 40 and cassettes be dedicated entirely to the wafers in a batch. Thus, the same boats are always used with a process tube. Also, the cassettes 18 in which certain wafers are presented to the improved apparatus are the same cassettes 18 in which the processed wafers are returned.

Figure 5:
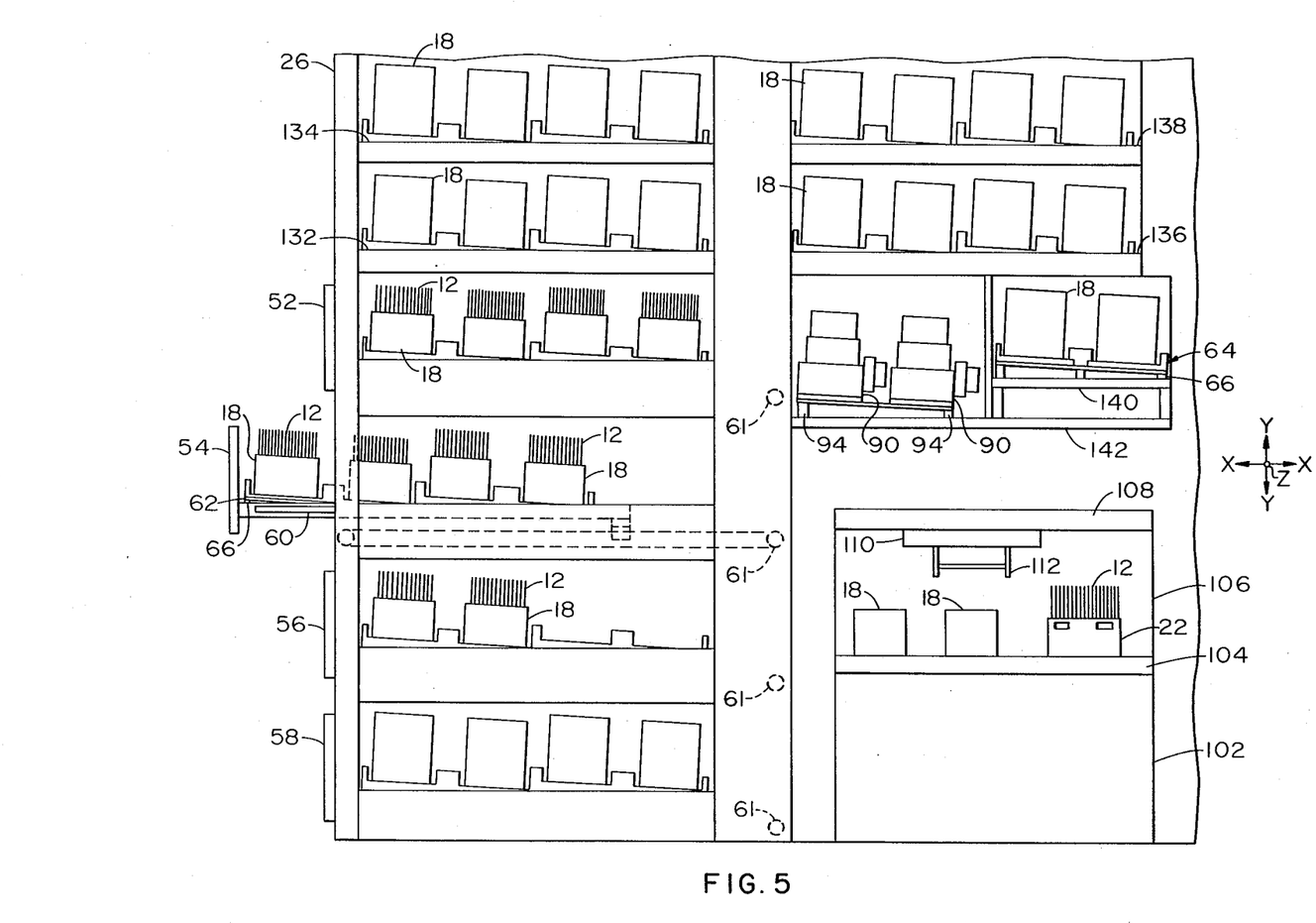
FIG. 5 is a schematic front view of the cassette handling area of FIG. 3.

The cabinet 26 has four input/output drawers 52, 54, 56 and 58, each of which is dedicated to one of the four process tubes 42, 44, 46 or 48. As is best shown in FIG. 5, each drawer such as drawer 54 is extendable on slide mechanisms 60 located on either side of the drawer between an extended open position shown by drawer 54 and a retracted closed position within the cabinet 26 shown by the other three drawers 52, 56 and 58. Each drawer is driven between these two positions by a microprocessor-controlled pulley system 61 mounted on the frame of the cabinet 26 below the drawer which reciprocates a pulley belt attached to the rear of the drawer. U.S. patent application Ser. No. 863,960, filed May 16, 1986, entitled "Semiconductor Wafer Carrier Input/Output Drawer" is directed to the drawers 52, 54, 56 and 58 and is hereby incorporated by reference for its detailed disclosure of the drawer structure. The drawers 52, 54, 56 and 58 are extendable in a direction parallel to the longitudinal axes of the process tubes 42, 44, 46 and 48, which direction will (following conventional terminology) be referred to as the "X" direction. In addition, the vertical and the third orthogonal directions will be referred to as the "Y" and the "Z" directions, respectively.

Figure 6:
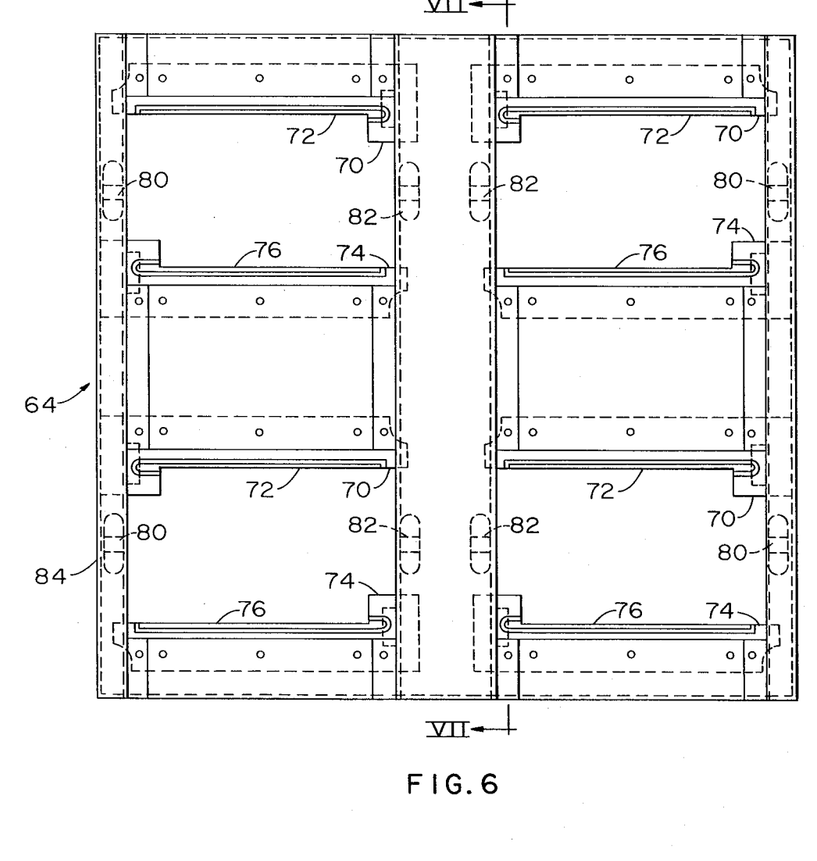
FIG. 6 is a plan view of a cassette nest plate of the input/output drawers and empty cassette storage shelves.
Figure 7:
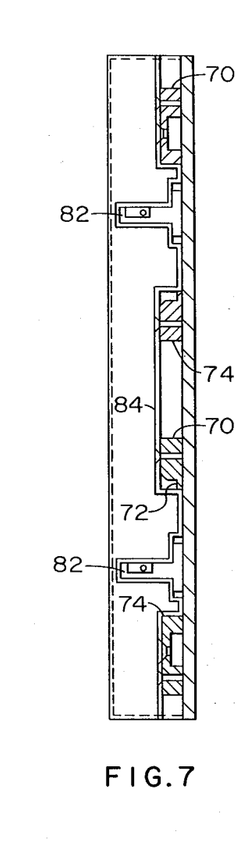
FIG. 7 is an end view of the cassette nest plate of FIG. 6 generally taken along line VII—VII.

When a drawer such as drawer 54 is opened, wafer ladened cassettes 18 may be placed in one of eight identical nests on a nesting plate 62. As U.S. patent application Ser. No. 863,960 discloses, the nesting plate 62 has two inclined (at about 3° to 5°) supporting surfaces 64 supported on legs 66 fastened to the drawer for nesting up to four carriers 18 each. The slight inclination tilts the wafers 12 in the carriers 18 so that the faces of the wafers 12 rest upon the carriers 18 and do not vibrate in the slots 19 of the carriers 18. FIGS. 6 and 7 show one supporting surface 64 having four such nests. Each nest is defined by a pair of blocks 70, 74 having lower ledges 72 and 76 respectively for receiving the legs of the carriers 18. Conventional locating pins 78 may cooperate with notches (not shown) in the legs of the carriers 18 for locating the carriers 18 along the ledges. Circuitry for sensing proper nesting of the carriers includes a pair of standard photocells 80, 82 located on either side of each nest and a conveniently located LED display (not shown) within sight of the operator. A shroud 84 covers the inclined surface 64, the blocks 70, 74 and the photocells 80, 82. When a loaded drawer 52, 54, 56 or 58 is closed, the cassettes 18 may be then removed at the open side of the cabinet 26 by a programmable elevator ("robot") 202.

Figure 8:
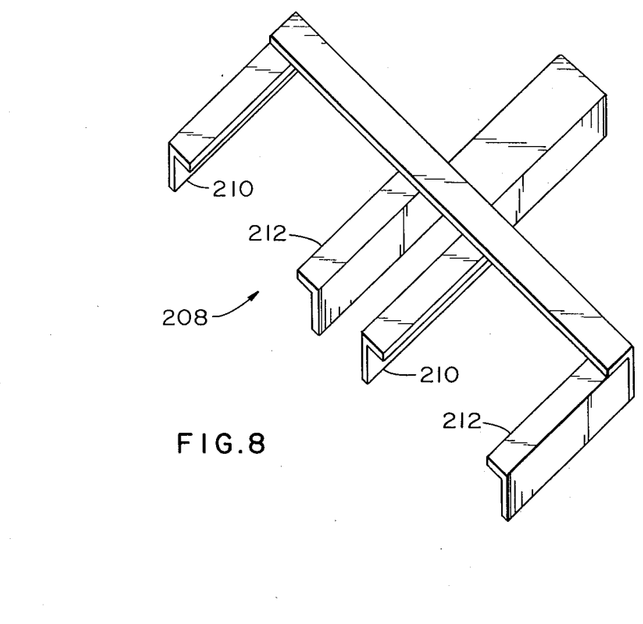
FIG. 8 is a perspective view of an end effector for transporting two cassettes.

FIGS. 1 and 2 show an end effector 206 on the first carrier (i.e., cassette) elevator 202 which may be aligned with a cassette 18 in a closed drawer for engaging slots 19 (see FIG. 1) or other similar structure of the cassettes 18 to pick up the cassette 18. Preferably, two or more cassettes are transferred simultaneously. FIG. 8 shows a four prong fork 208 used to pick up and transfer two cassettes 18, 18 simultaneously. The fork 208 has two pairs of facing angle members 210 and 212, each member having a horizontal portion for engaging slots 17 of the carriers 18 and vertical portions for engaging the ends of the carriers 18 should they slide. The cassettes are withdrawn from the drawer and placed upon one of two conventional flat finders 90, 90 mounted on legs 94 (FIG. 5) in the cabinet 26 between the drawer 52 and the furnace loading station 30. When the legs of a cassette 18 are placed upon a flat finder 90, a switch is depressed which causes a motor driven roller 92 located under the wafers 12 to rotate and align the wafers. The cassettes 18, 18 ladened with aligned wafers 12 are then transported by the elevator 202 with fork 208 from the flat finders 90, 90 to a stand 104 on a wafer transfer machine 102 mounted below in the cabinet 26. FIG. 5 illustrates a wafer transfer machine 102 for transferring wafers between two cassettes and a boat like that shown in U.S. Pat. No. 4,573,851, which is hereby incorporated by reference. The wafer transfer machine as illustrated has an overhead member 108 supported above the stand 104 by vertical support 106 for supporting a depending head 110 which travels in a way (not shown) in the X direction between two cassettes 18, 18 and a boat 22 for transferring the wafers in grippers 112 held by the traveling head 110.

The empty cassettes 18, 18 on the stand 104 of the wafer transfer machine 102 are then picked up by the fork 208 of elevator 202 and transported to empty cassette storage 130 where the cassettes 18, 18 are nested on shelves fastened to the cabinet 26 like the nesting plates 62 in the drawers 52, 54, 56 and 58 (and, thus, need not be described). The cassette storage 130 has four shelves 132, 134, 136 and 138, each of which may nest up to eight carriers 18. In order to lessen the possibilities of cross-contamination, each shelf is dedicated to a particular drawer 52, 54, 56 or 58 so that the processed wafers 12 may be returned to the same carriers 18 in which they are received. Thus, e.g., shelf 132 is dedicated to drawer 52; shelf 134 to drawer 54; shelf 136 to drawer 56 and shelf 138 to drawer 58. An additional storage shelf 140 (also like the drawer nest plate 62) for nesting up to four extra carriers 18 is mounted on a platform 142 in the cabinet 26 beside the flat finders 90, 90 for temporarily holding empty cassettes which are to be stored in the drawers during the wafer processing time until other cassettes can be transported out of the drawer.

Figure 4:
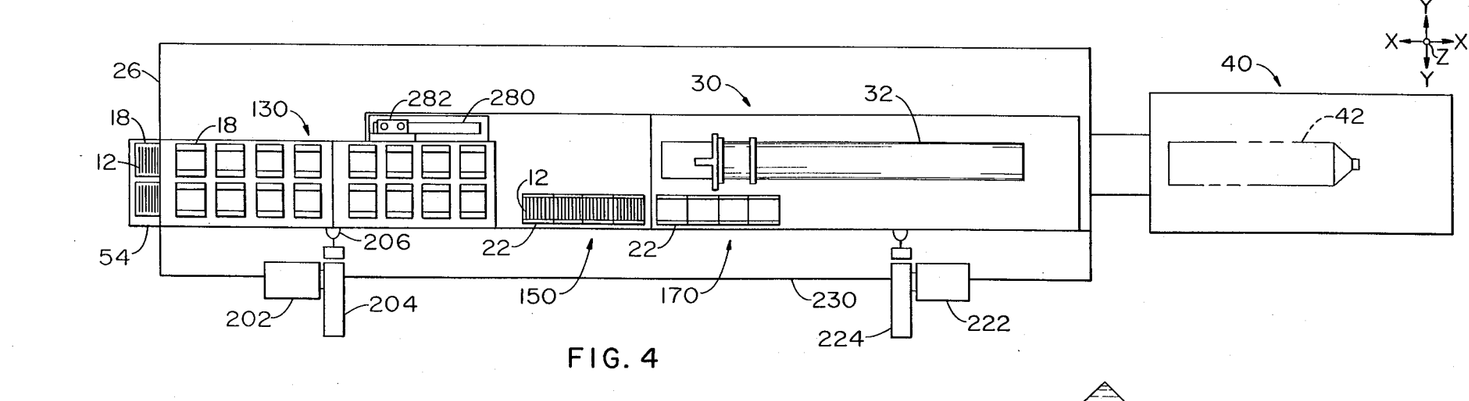
FIG. 4 is a schematic plan view of the apparatus and furnace of FIG. 3.

The elevator 202 for transporting the plastic cassettes 18 (or other first carriers) shown in FIGS. 3 and 4 is a conventional cartesian coordinate elevator which is guided by a set of rollers 203 on an underlying X directed rail 230 (such as a Thompson way) running along the front side of the cabinet 26 and furnace loading station 30. A similar second elevator 222 for transporting the boats 20 (or other second carriers) is guided by a set of rollers 223 on the same rail 230. The elevators 202, 222 are drivingly guided and supported by overhead twin rails 232 by linear bushings in housings 205 and 225, respectively. The cassette elevator 202 generally runs along the rail 230 from the side of the input-/output drawers 52, 54, 56 and 58 to the cassette stations on the wafer transfer machine 102. The boat elevator 222 generally runs from the boat station on the wafer transfer machine 102 and the cantilevered end of the boat loaders 32, 34, 36 and 38. The configurations of the elevators 202 and 222 and their end effectors permit both elevators to simultaneously operate at the wafer transfer machine 102 without interference from the other. Elevator overtravel and collision is prevented by conventional limit switches (not shown). Also, conventional safety mats (not shown) having weight-sensors may be used to disable an elevator 202 or 222 should, e.g., an operator be standing along its path. Each elevator 202 and 222 has an arm 204, 224 respectively mounted along side in a way (not shown) for vertical movement in the Y direction. Each arm 204, 224 has a way (not shown) for horizontal movement of the arms 204, 224 in the Z direction between the elevators 202, 222 and the various cassette 18 and boat 20 loading locations. The cassettes 18 are engaged by two (206 on FIG. 1) or four (208 on FIG. 8) prong end effectors attached to the end of cassette elevator arm 204 for transport to the various locations described above.

The boats 20 are normally engaged, e.g., in bores 21, by prongs of a fork 226 of elevator 222 for transport from the wafer transfer machine 102 to an in-process ladened boat storage 150, to an in-process empty boat storage 170 or to closed type boat loaders 32 and 34 or to paddle type boat loaders 36 and 38. However, boats used in closed boat loaders 32 and 34 which have cantilevered tubes with a bottom longitudinal slot must be supported at their bottoms so that the boats can be carried into the center of a tube with a portion of the fork extending upwardly through the slot.

Figure 9:
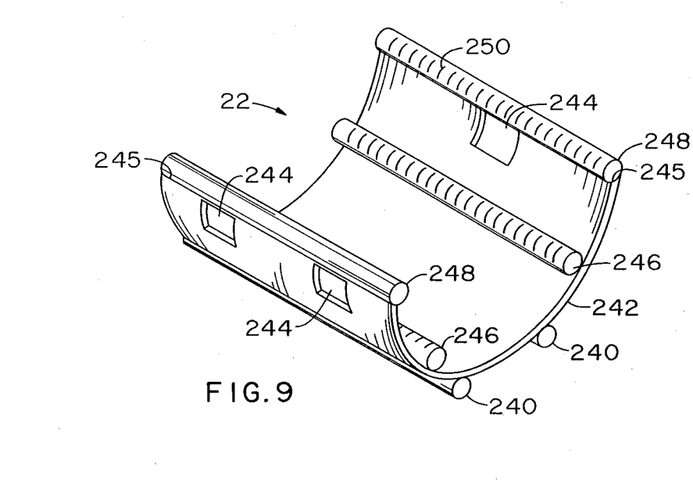
FIG. 9 is a perspective view of a boat which can be supported by two different ways.

FIG. 9 shows a boat 22 which has been designed for use with both closed boat loaders 32 and 34 and open paddle boat loaders 36 and 38. The boat generally has two bottom rails 240 supporting a shell 242 having three longitudinally spaced slots 244 below its upper edges 245. Inside the shell are two upper rails 248 along the upper shell edge and two lower rails 246 having conventional spaced apart slots 250 for supporting wafers in vertical spaced relationship. The boats 22 may be supported and positioned by their bottom rails 240 in open boat loaders 36 and 38 or supported and positioned by the shell 242 and bottom rails 240 in the closed boat loaders 32 and 34. The bottom rails 240 are used to support and position boats on the wafer transfer machine 102. U.S. patent application Ser. No. 863,963, filed May 16, 1986, entitled "Wafer Boat Transfer Tool" which is hereby incorporated by reference for its disclosure of the boat 22 and an end effector for supporting the boat by two means.

The wafer ladened boats 22 (or 20) on the wafer transfer machine 102 may be transported by the second carrier elevator 222 to a boat loader 32, 34, 36 or 38. Preferably, a loaded boat 22 is transported to loaded boat storage 150 where the boats are queued so that the boat loaders (and process tubes) can be quickly loaded and most efficiently scheduled. Certain locations in the storage area are dedicated to each process tube 42, 44, 46 and 48 to prevent the inadvertent use of a boat in a contaminating process. Thus, the loaded boat storage 150 comprises a rack 152 mounted to the frame of the cabinet 26 (or a loading station cabinet) having at least four nesting locations for the boats dedicated to process tube 42. Similarly, rack 154 is dedicated to process tube 44, rack 156 to process tube 46, and rack 158 to process tube 48.

Figure 10:
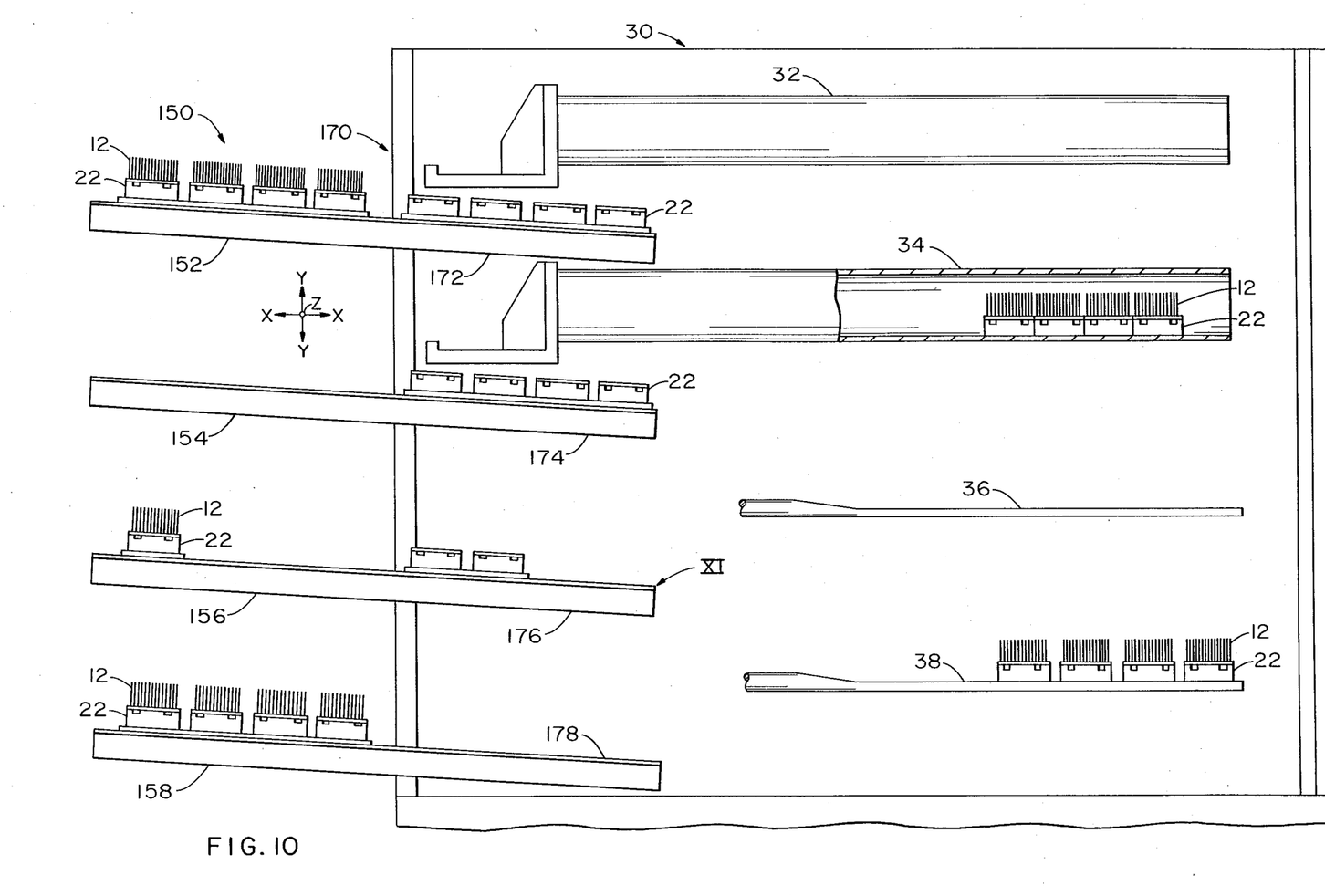
FIG. 10 is a schematic front view of the boat handling area of FIG. 3.

The emptied boats 22 (or 20) on the wafer transfer machine 102 are transported to empty boat storage 170 as shown in FIG. 10. Similar to the loaded boat storage area 150, the empty boat storage area has certain locations dedicated to each process tube 42, 44, 46 and 48 to prevent cross-contamination. Thus, the empty boat storage area 170 has a rack 172 mounted to the frame of the cabinet 26 (or a loading station cabinet) having at least four nesting locations for the boats dedicated to process tube 42. Similarly, rack 174 is dedicated to process tube 44, rack 176 to process tube 46, and rack 178 to process tube 48. Additional nesting locations must also be provided if boats carrying dummy wafers are used and/or if more boats are used in a furnace. Also, as FIG. 10 most clearly shows, the loaded boat storage rack and empty boat storage rack dedicated to a process tube may be at opposite ends of a structural member.

Figure 11:
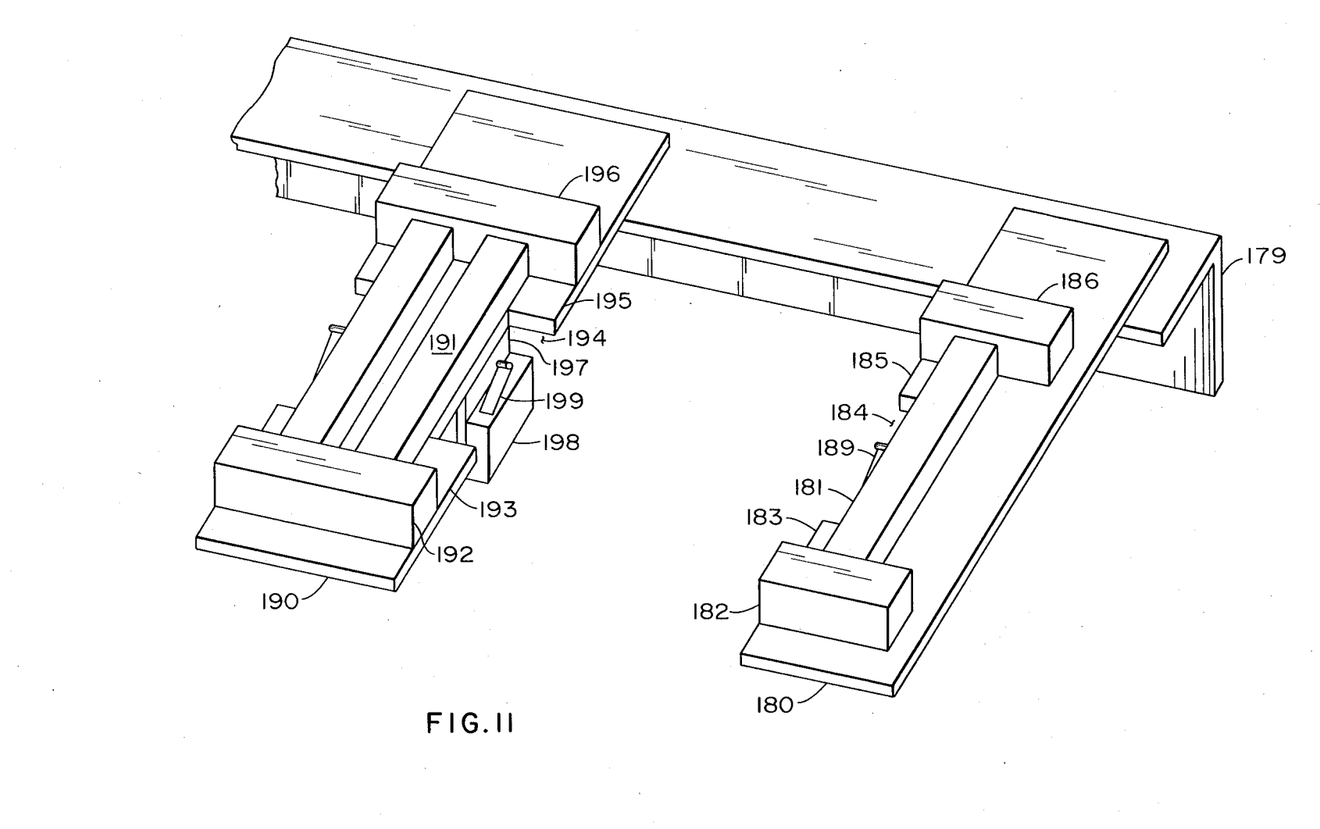
FIG. 11 is a partial perspective view of a boat storage nest generally taken along view line XI of FIG. 10.

FIG. 11 best shows a typical boat nesting location in the loaded boat storage 150 and the empty boat storage 170 areas. A nest is generally defined by two Z directed blocks 181 and 191 each extending between a pair of X directed blocks 182, 186 and 192, 196, respectively, all of which are fastened on landing plates 180 and 190, respectively. The landing plates 180 and 190 extend from a structural member such as angle 179, which in turn is bracketed or otherwise fastened to the frame of cabinet 26 at a slight angle of about 3°–5° to the horizontal plane. The inclination causes the faces of wafers 12 to rest against the slots of the carriers and to not vibrate. Between the X directed blocks 182, 186 and 192, 196 are lands 183, 185 and 193, 195, respectively, for supporting the ends of the rails 240 of a boat 22 (or 20). Between the lands 183, 185 and 193, 195 are cut out portions 184 and 194 of landing plates 180 and 190, respectively, below which switches 188 and 198 are fastened to support members 187 and 197, respectively, which in turn are fastened to the undersides of the landing plates 180 and 190, respectively. Upwardly projecting sensing arms 189 and 199 of switches 188 and 198, respectively, extend above landing plates 180 and 190, respectively, such that the shell 242 of a boat 22 deflects the arms 189 and 199 when the bottom boat rails 240 are landed.

As FIG. 4 depicts, the cabinet 26 has system 280 for controlling air flow through the cabinet 26 and into the exhaust 282. Internal baffle walls (not shown) within the cabinet 26, e.g., between the rear of the input/output drawers 52, 54, 56 and 58 and the other areas of the cabinet 26 and between the back side of the storage areas and passage ways in the cabinet 26 behind the back side prevents uncontrolled air currents from carrying dust and other airborne contaminants from one area to another.

In the operation of the apparatus shown in FIG. 3, the principal economic concern is to keep the process tubes of furnace 40 on line and minimize batch turnaround time. Thus, there is a queued batch of wafers in boats 22 (or 20) on the loaded boat storage rack 152, 154, 156 or 158 awaiting loading at the end of processing of a batch of wafers in each process tube 42, 44, 46 or 48. FIG. 3 generally illustrates the process tubes at four different stages of processing. The top process tube 42 and associated apparatus illustrates the turnaround stage where boats 22 have been emptied and placed in nests on the empty storage rack 172 and the next batch of wafers in boats 22 are queued in nests on the loaded boat storage rack 152. The queued boats will be next transported to the boat loader 32 by the boat elevator 222 to begin the next processing operation of process tube 42. The processed wafers which were in the empty boat now on rack 172 have been transferred to the carriers 18 in the top extendable drawer 52 which will be opened. The empty cassettes 18 which originally carried waiting wafers 12 now in the boats 22 on rack 152 are stored in the nests on shelf 132.

Process tube 44 and its associated apparatus illustrates a loaded boat loader about to load the boats 22 into the process tube 44. The boats 22 on the boat loader 34 were loaded by the elevator 222 from rack 154. The empty cassettes 18 which originally carried the wafers 12 on the boat loader are nested on shelf 134. The wafers 12 which were in the empty boats 22 on rack 174 are in carriers 18 in open drawer 54. These carriers 18 may be unloaded from the drawer 54 and another lot of carriers 18 may then be placed in the drawer 54 for processing.

Process tube 46 and its associated apparatus illustrate a process tube in operation and one boat 22 of the next load queued up on the loaded storage rack 156. The cassettes 18 which originally carried the wafers now in the process tube 46 are nested on shelf 136. The two cassettes 18 which originally carried the wafers 12 now on rack 156 are temporarily nested on shelf 140. A second boat 22 dedicated to process tube 46 is on the wafer transfer machine 102 being loaded with wafers 12 from two cassettes 18, 18 which were transported by the elevator 202 from drawer 56 by way of the flat finders 90, 90. The two empty boats 22 on empty boat rack 176 will in turn be loaded with wafers now contained in the two carriers 18, 18 on the flat finders 90, 90 or the two carriers 18, 18 still in the drawer 56. All of the eight empty cassettes which originally carried the wafers 12 to be placed in boats 22 to be queued up on rack 176 will then be transported back to the drawer 56.

The bottom process tube 48 and its associated apparatus illustrates the last stages of processing where the boats 22 have been pulled from the processing tube 48 and are still on the paddle of the boat loader 38. The cassettes 18 which originally carried the wafers 12 in the boats 22 on the boat loader 38 are on shelf 138 and the cassettes 18 which originally carried the wafers 12 in the queued boats 22 on the loaded boat rack 152 are in the drawer 58. Elevator 222 will transport the boats 22 from the boat loader 38 to the wafer transfer machine 12 and then to the rack 178. The cassette elevator 202 must transport the cassettes 18 on shelf 138 to the wafer transfer machine 102 to receive the wafers 12 from the boats and then transport the cassettes 18 to shelf 140. After four cassettes 18 have been loaded and transported to shelf 140, four empty cassettes in the drawer 58 may then be transported to the four empty nests on shelf 138 and the four cassettes 18 on shelf 140 may then be placed in the drawer 38. This cycle may then be repeated to return all of the wafers in their original carriers 18 back to the drawer 18 when the stage illustrated by the top process tube 42 will begin another cycle.

Another embodiment of the invention having a lower throughput (but considerably less complicated) would not have empty cassette storage shelves such as 134-138 or loaded boat storage 150. In this embodiment, a cassette 18 would be transported by the cassette elevator 202 from a drawer to a flat finder 90, to a wafer transfer machine 102 and to a storage (e.g., on shelf 140 or in the drawer). An empty cassette 18 would be returned from storage to the wafer transfer machine and back to the drawer. After being transported from an empty boat storage area, the boat 22 on the wafer transfer machine would be transported by the boat elevator 222 to the boat loader. After processing, the boat elevator 222 would transport the loaded boat 22 on the boat loader back to the wafer transfer machine 102 and then transport the unloaded boat back to empty boat storage. If this embodiment were utilized with a paddle type boat loader such as 36 or 38 of FIG. 3, then the conventional boats such as boats 20 of FIG. 1 could be used and the empty boats 20 could be stored on the paddles themselves rather than at a separate station. Of course, such an embodiment may also be used with multiple processing chambers, where each chamber would have a drawer dedicated to it.

While a presently preferred embodiment of the invention has been shown and described, it is to be distinctly understood that the invention is not limited thereto but may be otherwise variously embodied within the scope of the following claims.

What is claimed is:

1. Apparatus for transferring semiconductor wafers in a first carrier to a second carrier and transporting the wafer ladened second carrier to a second wafer carrier loading means operatively associated with a wafer processing chamber comprising an input drawer which is movable between an extended position for manually loading the wafer ladened first carriers into the drawer and a retracted position for subsequent non-manual removal of the carriers from the drawer;

a first carrier storage;

a wafer alignment means for orienting the wafers in the first carriers;

a wafer transfer means for transferring the wafers from the first carrier to the second carrier;

a first elevator means having an end effector for transporting the first carrier to and from the retracted drawer, the first carrier storage, the wafer alignment means and the wafer transfer means;

a second carrier storage;

a second elevator means having an end effector for transporting the second carrier to and from the wafer transfer machine, the second carrier storage and the second wafer carrier loading means.

2. The apparatus of claim 1 wherein the apparatus comprises a plurality of drawers and chambers and each drawer is dedicated to a different processing chamber.

3. The apparatus of claim 2 further comprising a second carrier queueing means and wherein the second elevator means also transports the second carrier to and from the second carrier queueing means.

4. A method of transferring semiconductor wafers from first carriers into second carriers and transporting the wafer ladened second carriers to a second wafer carrier loading means operatively associated with a wafer processing chamber comprising the steps of
   extending a drawer to an open position where the first carriers ladened with unprocessed wafers may be placed into the drawer and processed wafers may be removed from the drawer;
   retracting the drawer to a closed position;
   transporting the first carriers ladened with unprocessed wafers with a first carrier elevator means from the closed drawer to a wafer alignment means;
   aligning the unprocessed wafers in the second carriers;
   transporting the carriers ladened with the aligned unprocessed wafers with the first carrier elevator means from the wafer alignment means to a wafer transfer means;
   transferring the wafers between the first carriers to the second carriers on the wafer transfer means;
   transporting the empty carriers between the wafer transfer means and first carrier storage with the first carrier elevator means;
   transporting the processed wafers in first carriers with the first carrier elevator means from the wafer transfer means to the closed drawer;
   transporting the wafer ladened second carriers with a second carrier elevator means between the wafer transfer means and the wafer carrier loading means associated with the processing chamber;
   transporting the empty second carriers with the second carrier elevator means between the wafer transfer machine and second carrier storage.

5. The method of claim 4 further comprising the step of
   transporting the carriers ladened with unprocessed wafers with the second carrier elevator means from the wafer transfer means to a queueing location before transporting the carriers to the wafer carrier loading means associated with the processing chamber.

6. The method of claim 4 wherein the wafers are to be processed in one of a plurality of processing chambers, including the steps of
   receiving the first carriers containing unprocessed wafers in one of a plurality of drawers dedicating each drawer to a different processing chamber;
   dedicating boats to each processing chamber and returning the processed wafers to the first carriers in which they were received.

* * * * *